US009124234B1

(12) United States Patent
    Petrovic (10) Patent No.: US 9,124,234 B1
(45) Date of Patent: Sep. 1, 2015

(54) METHOD AND APPARATUS FOR ADAPTIVE AUTOMATIC GAIN CONTROL

(71) Applicant: Entropic Communications, Inc., San Diego, CA (US)

(72) Inventor: Branislav Petrovic, La Jolla, CA (US)

(73) Assignee: Entropic Communications, LLC., Carlsbad, CA (US)

( * ) Notice: Subject to any disclaimer, the term of this patent is extended or adjusted under 35 U.S.C. 154(b) by 0 days.

(21) Appl. No.: 14/271,060

(22) Filed: May 6, 2014

Related U.S. Application Data (60) Provisional application No. 61/978,642, filed on Apr. 11, 2014.

(51) Int. Cl.
*H04B 3/46* (2015.01)
*H03G 3/30* (2006.01)
*H04L 27/00* (2006.01)
*H04B 17/336* (2015.01)

(52) U.S. Cl.
CPC .......... *H03G 3/3078* (2013.01); *H04B 17/336* (2015.01); *H04L 27/0002* (2013.01)

(58) Field of Classification Search
CPC ..... H04L 1/20; H04L 1/0009; H04L 27/2647; H04B 17/006; H04B 17/005
USPC ......................................................... 375/227
See application file for complete search history.

(56) References Cited

U.S. PATENT DOCUMENTS

| | | | |
|---|---|---|---|
| 2003/0142768 A1* | 7/2003 | Sintonen ........................ 375/345 |
| 2009/0079611 A1* | 3/2009 | Hwang et al. ................. 341/155 |
| 2010/0046679 A1* | 2/2010 | Kajakine et al. .............. 375/345 |
| 2010/0119019 A1* | 5/2010 | Ito .................................. 375/344 |
| 2011/0274223 A1* | 11/2011 | Agarwal et al. ............... 375/345 |
| 2012/0257694 A1* | 10/2012 | Balakrishnan ................ 375/340 |
| 2013/0279556 A1* | 10/2013 | Seller ............................ 375/227 |
| 2014/0340153 A1* | 11/2014 | Wilhelmsson et al. ....... 330/278 |

* cited by examiner

*Primary Examiner* — Juan A Torres
(74) *Attorney, Agent, or Firm* — McAndrews, Held & Malloy (57) ABSTRACT

Systems and methods for dynamically adjusting the gain in a receiver front end to have a desired amount of headroom, based upon a measurement of the signal to noise ratio (SNR) of the output of a digital to analog converter and the amount of degradation to the SNR due to previous adjustments to the gain.

21 Claims, 6 Drawing Sheets

METHOD AND APPARATUS FOR ADAPTIVE AUTOMATIC GAIN CONTROL

RELATED APPLICATIONS

This application claims priority benefit of U.S. Provisional Patent Application Ser. No. 61/978,642, filed Apr. 11, 2014 and entitled "Method and Apparatus for Adaptive Automatic Gain Control", which is herein incorporated by reference in its entirety.

TECHNICAL FIELD

The disclosed method and apparatus relate to broadband receivers, and more particularly to systems for efficiently receiving broadband signals with large dynamic range.

BACKGROUND

Designers of broadband receivers face several challenges today. One such challenge is presented by the very nature of broadband receivers. That is, in many of the communications systems of today, receivers are required to digitize incoming signals over a broad frequency range. These signals may have a very large dynamic range (i.e., power levels can vary greatly). For the purpose of this discussion, the term "power level" is used broadly to refer to either the amount of power in a particular frequency band (i.e., power density) or the amount of power over the entire band used by the particular received signal (i.e., total signal power). In addition, a "signal" is defined as the energy within a frequency band that is used to represent information (i.e., "content") being communicated from a transmission source to the receiver. Accordingly, a receiver may receive several signals, some such signals from the same transmission source, each such signal using a different frequency band, and some such signals from different transmission sources using different frequency bands.

Figure 1:
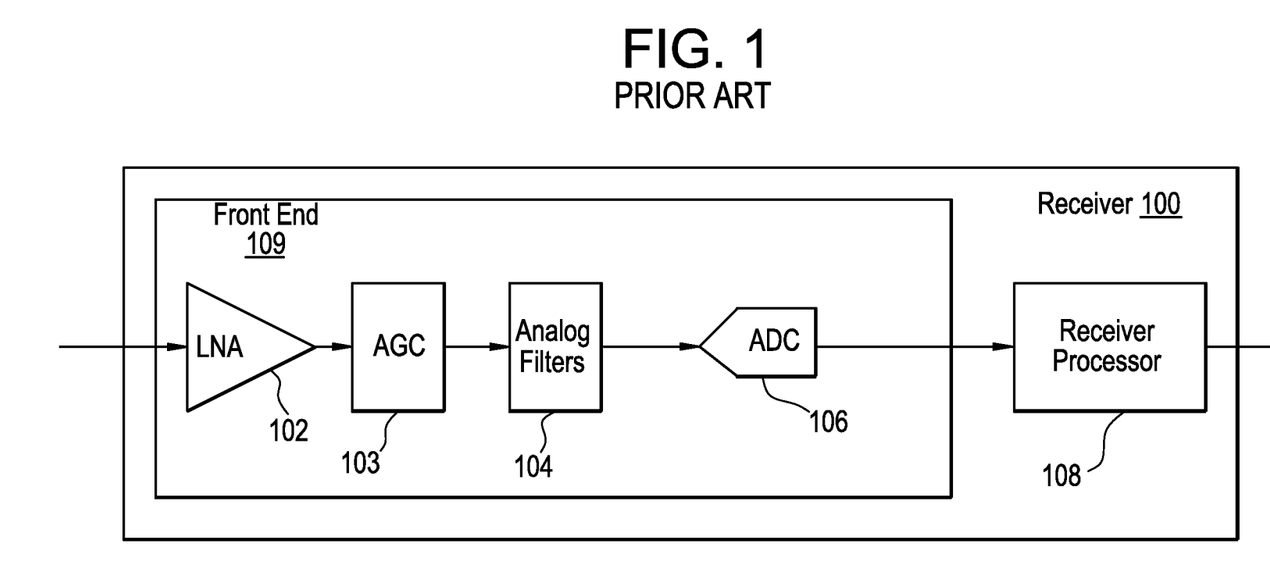
FIG. 1 is a simplified block diagram of a typical receiver.

FIG. 1 is a simplified block diagram of a typical receiver 100. A low noise amplifier (LNA) 102 initially receives the incoming signals. The LNA 102 amplifies the signals. The output from the LNA 102 is the coupled to an input of an automatic gain control (AGC) circuit 103. The AGC circuit 103 attempts to ensure that the power of the incoming signal remains essentially constant for incoming signals of varying power levels. It is common today for such AGC circuits to drive the incoming signal to the highest level possible without causing distortion due to clipping of the signal.

The output of the ACG circuit 103 is coupled to the input of a set of analog filters 104. These analog filters 104 ensure that energy outside the desired frequency band is removed before further processing of the signals. The filtered signals are then output from the analog filters 104 to an analog to digital converter (ADC) 106. The ADC 106 takes the received filtered analog signals and generates a digital representation of these received signals. The digital representation of the analog input takes the form of a series of digital values that each indicate the amplitude of the analog signal at a particular point in time. The combination of the LNA 102, the AGC circuit 103, the analog filters 104 and the ADC 106 comprise the receiver front end 109.

The digital output from the ADC 106 is then coupled to a Receive (RX) processor 108. The RX Processor 108 performs whatever processing is desired for the received signals. For example, the RX Processor 108 might process the signals to extract viewable video content and prepare that content for display on a monitor (not shown).

One problem that arises comes from the fact that unexpected bursts of interference can occur that will drive the output of the AGC to a level that will exceed the capability of the ADC. That is, the output of the ADC will be compressed, since the ADC will hit full scale before the signal at the input of the ADC has reached its highest level. Accordingly, the ADC will output the same erroneous value (i.e., the full scale value) for each input above that level that initially reaches the full scale value. This is commonly referred to as "clipping" and causes errors in data transmission. For example in networks that conform to the well-known Multimedia over Coax Alliance (MoCA) standard, a burst interference that drives the ADC into clipping will result in data packet errors. Such a burst interference may be caused by adjacent channel activity or off-air interference from cell or LTE (Long Term Evolution) phones.

The AGC is designed to drive the input to the ADC 106 as close to full scale as possible. In some cases, headroom is designed into the ACG circuit 103 to ensure that there is some safety margin (i.e., a "backoff" or "headroom") between the full scale value at the output of the ADC 106 and the value that is output by the strongest received signal. For most signals, the peak power exceeds the average power. The minimum headroom needs to be sufficient to accommodate the peak power. Typically, a fixed amount of backoff is provided to deal with the worst case. In addition, the backoff accounts for unit to unit variability, temperature variations and other factors. Therefore, the AGC provides less gain than is desirable in some cases, but more gain than is necessary in other cases. If the selection of what is "worst case" is made too aggressively, then it is more likely that from time to time, an interfering signal will cause clipping in the ADC 106. However, if a more conservative approach is taken, the likelihood is that for the majority of the time, the front end will not be providing as much gain as would otherwise be desired.

In some cases, this can be dealt with by adjusting the modulation that is used and thus increasing the signal to noise ratio margin and so reducing the impact when interference is present. However, in many systems in use today, it is not possible to control the modulation sufficient rapidly to account for short bursts of interference. Furthermore, in some cases, the adjustments to the modulation are made based on an analysis of the signals that are made at discrete times. Interference might not be present during those discrete times. Therefore, the modulation will not be adjusted to account for the interference.

Further complicating the matter, in some cases receiver front end circuits use a variable power supply. In such cases, the amount of gain that is appropriate for one power supply output level will not be appropriate for another power supply output level.

Accordingly, there is presently a need for an receiver front end that can receive signals with a very large dynamic range and digitize them without compressing the large signals, while still maintaining a high resolution for weaker signals in the face of intermittent bursts of noise.

SUMMARY

Various embodiments of the disclosed method and apparatus for receiving broadband content are presented. Some of these embodiments are directed toward systems and methods for establishing the proper level of gain adjustment within the front end of a receiver.

In accordance with the disclosed method and apparatus, a measure of the signal to noise ratio (SNR) is made. Alternatively, other similar qualitative measurements can be made in place of the SNR measurement. If the measured SNR is above a predetermined minimum value, then the gain in the AGC is reduced. Another measure of the SNR is then made. If the SNR remains above the minimum value, then the difference between the SNR prior to the gain adjustment and the SNR after the gain adjustment is calculated. This difference is referred to as the "delta SNR". If the delta SNR is below an allowable SNR degradation value, then the gain is again reduced by an incremental amount. This process continues until the SNR either drops below the minimum acceptable value or the delta SNR exceeds the acceptable amount.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION

In one example of the disclosed method and apparatus, a broadband receiver uses an automatic gain control (AGC) control module to control the gain of an AGC module within the front end of the receiver.

Figure 2:
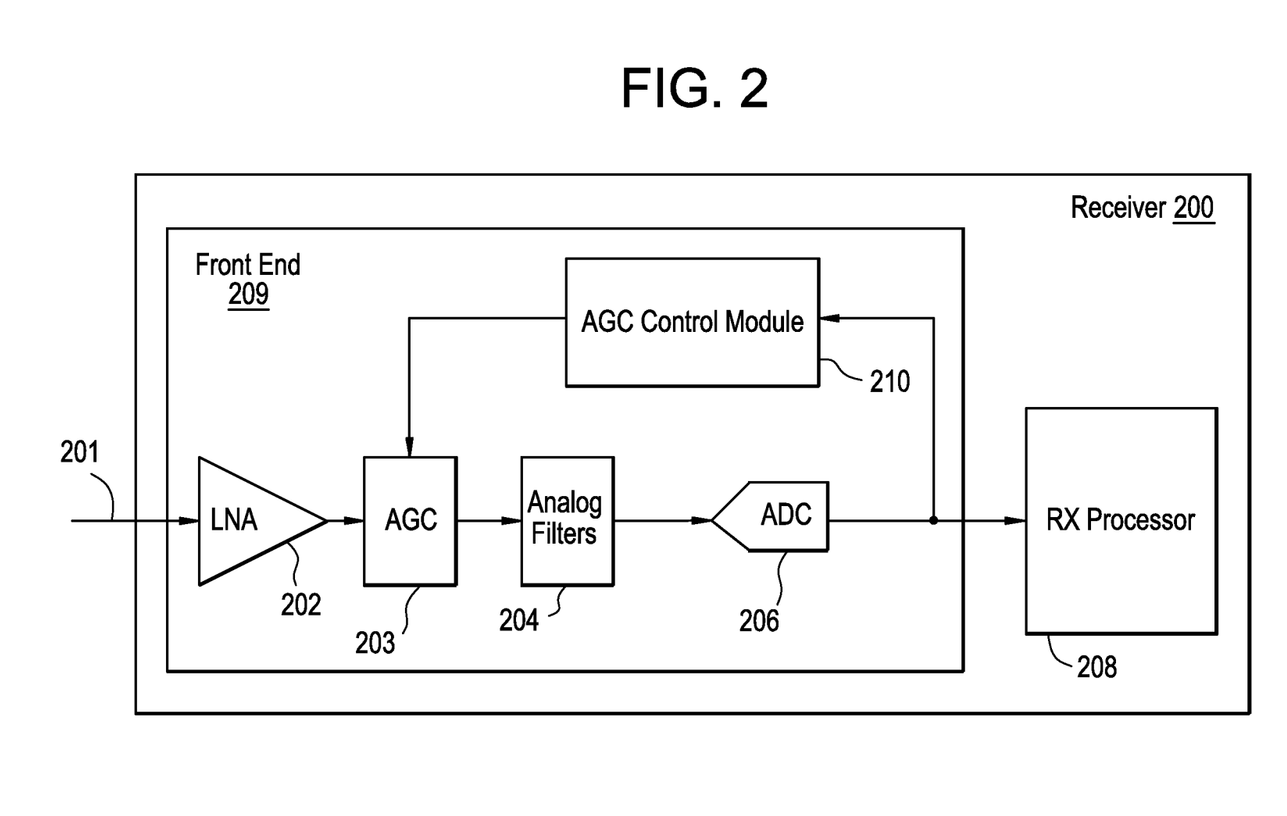
FIG. 2 is a simplified block diagram of a receiver in accordance with one embodiment of the disclosed method and apparatus.

FIG. 2 is a simplified block diagram of a receiver 200 comprising a receiver (RX) processor 208 and a receiver front end 209. The receiver front end 209 comprises a low noise amplifier (LNA) 202, an AGC module 203, an analog filter module 204, an analog to digital converter (ADC) 206 and an AGC Control Module 210. An input signal 201 is coupled to the input of the LNA 202. The output of the LNA 202 is coupled to the input of the AGC module 203. The AGC module 203 provides variable gain to the signal output from the LNA 202. The gain controlled output from the AGC module 203 is then coupled to the input of the analog filter module 204. The analog filter module 204 removes signals that are outside of the frequency range of interest. The output from the analog filter module 204 is then coupled to the input of the ADC 206. The ADC 206 digitizes the analog signal output from the filter module 204. The digitized signal can then be processed by the Rx processor 208. The RX processor 208 provides decoding, demodulating, video processing, etc. It will be understood by those skilled in the art that the type of processing that the RX processor 208 performs will depend upon the type of receiver 200.

The AGC Control Module 210 receives information from the ADC 206. The received information allows the AGC Control Module 210 to make informed decisions regarding the amount of gain to be added to input signal 201 to ensure that the ADC 206 is used most efficiently and effectively. In accordance with one embodiment of the disclosed method and apparatus, the information received from the ADC 206 is sufficient to allow the AGC control module 210 to determine the signal to noise ratio (SNR) of the received signal.

Figure 3:
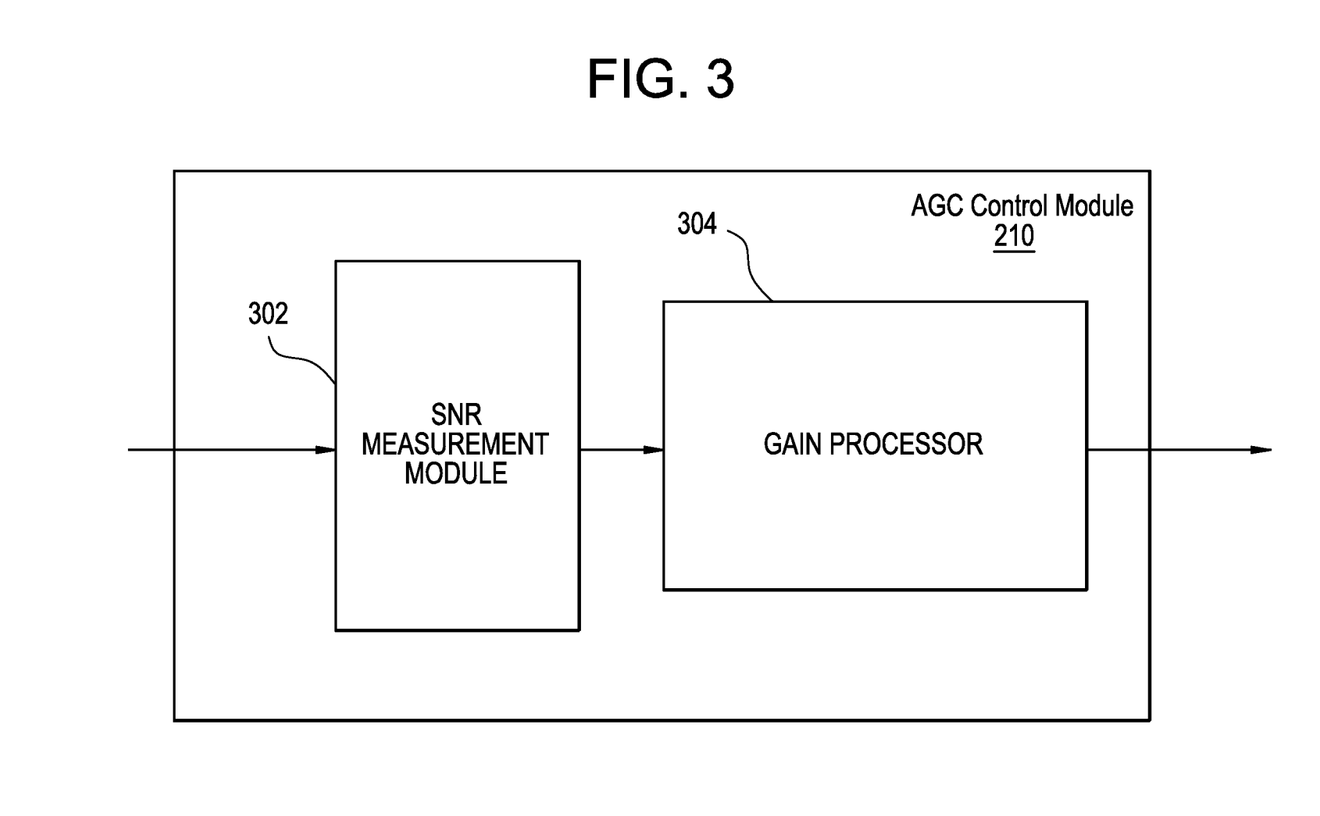
FIG. 3 is a simplified block diagram of the AGC Control Module in accordance with one embodiment of the presently disclosed method and apparatus.
Figure 4:
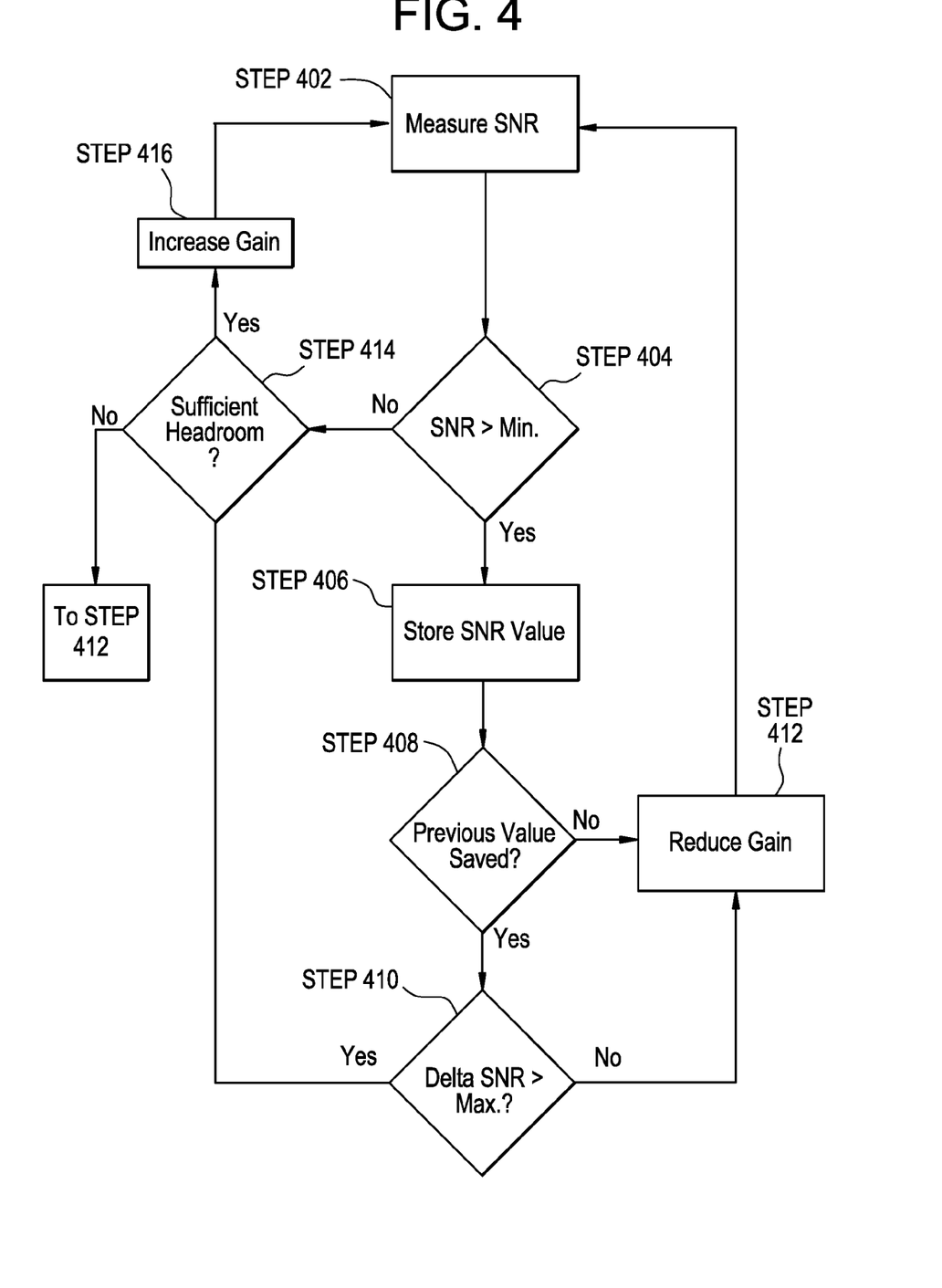
FIG. 4 is a flow diagram of the functions performed by the combination of the AGC Control Module and the AGC module of one embodiment of the presently disclosed method and apparatus.

FIG. 3 is a simplified block diagram of the AGC Control Module 210. FIG. 4 is a flow diagram of the functions performed by the combination of the AGC Control Module 210 and the AGC module 203. The AGC Control Module 210 includes a signal to noise ratio (SNR) measurement module 302 and a gain processor 304. The SNR measurement module 302 receives information from the ADC 206 from which the SNR measurement module 302 determines the SNR of the received signal (STEP 402). Alternatively, the RX processor 208 provides the SNR of the received signal 201 directly to the AGC Control Module 210. In that case, the SNR measurement module 302 may not be required. Accordingly, the input to the gain processor 304 is coupled to the RX processor 208. In either case, the gain processor 304 receives a measure of the SNR of the input signal 201. The gain processor 304 determines whether the SNR value is greater than a predetermined minimum SNR value (STEP 404). The predetermined minimum SNR value can be determined based upon the minimum value needed to decode information encoded on the input signal 201 with the required (or desired) accuracy.

If the SNR is not above the minimum required SNR, then in accordance with one embodiment of the disclosed method and apparatus, a check is made as to whether there is sufficient headroom to allow the gain of the AGC module 203 to be increased. In one embodiment of the presently disclosed method and apparatus, the AGC module 203 provides information to the ADC 206 from which this determination can be made. In one such embodiment, the determination is made based on predetermined knowledge of the peak-to-average ratio for signals that are likely to be received. The headroom should be at least some margin greater than the peak-to-average ratio. Alternatively, the peak-to-average ratio can be assumed to be in line with a Gaussian distribution of values. The amount of headroom can then be selected to have some margin over the peak-to-average ratio. In yet another embodiment, the output of the ADC 206 is statistically analyzed to determine the likelihood that clipping will occur at the gain value. This analysis is then used to determine the amount of headroom desired.

If there is sufficient headroom, then the gain is increased (STEP 416). However, if there is not sufficient headroom, then a further increase in the gain will result in further distortion and a degradation in the SNR. That is, it should be noted that it is possible that the SNR is less the then minimum (STEP 404) due to clipping of a relatively large input signal. Clipping will increase the amount of distortion that exists within the noise component $ND_{ADC}$ which is discussed further below with regard to FIGS. 5 and 6. Additional noise in the noise component $ND_{ADC}$ will drive the SNR down. Therefore, in one embodiment of the disclosed method and apparatus, if there is insufficient headroom (STEP 414), then the process will reduce the gain (STEP 412).

If the SNR is above the minimum required SNR, the gain processor 304 stores the value (STEP 406). If this is the first time through the process, then there will not be a previously saved SNR value. (STEP 408). If that is the case, then the gain processor 304 sends a command to the AGC module 203 to the AGC module 203 to adjust the gain down (STEP 412). In one embodiment, this downward adjustment is a relatively small incremental step.

If there was a previously saved value (STEP 408), then the difference between the saved value and the current value is calculated. This difference is referred to as the "delta SNR". If the delta SNR is smaller than a "maximum delta SNR" value (STEP 410), then the gain processor 304 sends a command to the AGC module 203 to adjust the gain down (STEP 412) in order to establish the SNR at a predetermined level. If not, then in one embodiment of the disclosed method and apparatus, the gain processor 304 sends a command to the AGC module 203 to adjust the gain up (STEP 414) to establish the SNR at the predetermined level. The process will then repeat continuously as shown by the arrow back to STEP 402 from either STEP 412 or STEP 416.

The delta SNR is a way to measure the amount of influence the noise component $ND_{ADC}$ 506 generated within the ADC 206 has one the SNR. This will be discussed further below with regard to FIG. 5 and FIG. 6.

In an alternative embodiment, the gain remains unchanged if the delta SNR is greater than the maximum delta SNR value. In another alternative embodiment, adjustments to the gain may cease if the output from the ADC 206 falls outside a desired range (i.e., either the amount of headroom falls below a desired minimum or the level of the ADC 206 output falls below a desired minimum).

It can be seen that this process will result in the gain being established at the point at which the SNR is very near the minimum required SNR for accurate demodulation (i.e., the SNR will be established at a predetermined level). In accordance with one embodiment, the adjustments to increase the gain are smaller than the adjustments to reduce the gain. In an alternative embodiment, the adjustments are the same size for both reducing and increasing the gain. In yet another embodiment, the adjustments to increase the gain are larger than the adjustments to reduce the gain. In yet another embodiment, the adjustments in the gain are non-monotonic to reduce the likelihood of divergence, increase the rate of convergence or reduce the likelihood or magnitude of oscillations in the gain. In yet another embodiment, the rate at which the gain converges to the desired level is increased by having larger gain adjustment steps during an acquisition mode and smaller gain adjustment steps during a maintenance mode. In yet another embodiment, the size of the adjustment can be based on the number of consecutive times the questions in STEP 404 and STEP 410 return the same answer. The more times the same answer is returned, the larger the adjustment. Once the answer to one of the questions changes, the size of the adjustment decreases. In yet another embodiment, hysteresis can be provided by changing the minimum in STEP 404 and changing the maximum used in STEP 410. That is, increasing the minimum used in STEP 404 for the next measurement if the last answer to the question in STEP 404 has changed from NO to YES. This ensures that small changes in the SNR do not cause the gain to be adjusted. Likewise, the minimum used in STEP 404 for the next measurement can be decreased if the last answer to the question in STEP 404 has changed from YES to NO. In one such embodiment, no adjustment to the gain will be made unless the difference between the SNR and the minimum is greater than a predetermined amount. The decision made in STEP 410 can be likewise adapted. In yet another embodiment, a check is made to ensure that there is sufficient headroom between the maximum amplitude input to the ADC 206 and the amplitude that will cause the ADC 206 to output a full scale value.

Figure 5:
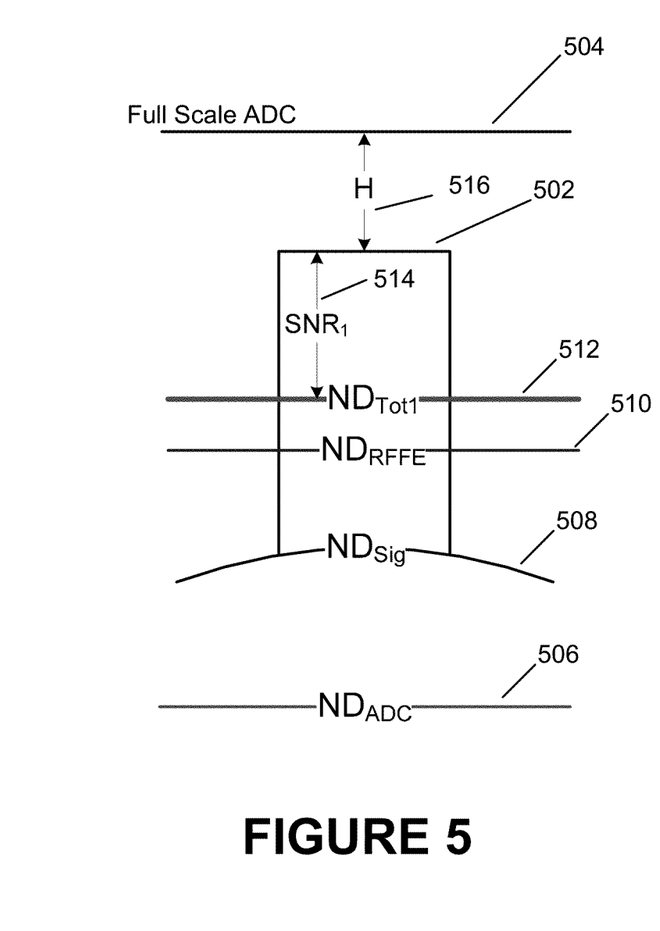
FIG. 5 illustrates the relationship between various noise components of the input to the ADC.

FIG. 5 illustrates the relationship between various noise components of the input to the ADC 206. The incoming signal 201 is shown to have a signal level 502. The ADC full scale value is shown at a level 504. Three noise components are shown. The first is the noise component $ND_{ADC}$ 506 generated within the ADC 206. This noise component 506 includes the noise that is due to distortion that occurs in the ADC 206. The second component of noise $ND_{Sig}$ 508 is that noise which is received at the input of the LNA 202 together with the signal 201. $ND_{Sig}$ 508 includes any distortion that occurs to the incoming signal prior to reception at the input to the LNA 202. The third component of noise $ND_{RFFE}$ 510 is the noise that is generated within the LNA 202 (i.e., RF front end noise and distortion). The sum of these three noise and distortion components is shown as $ND_{totl}$ 512. It will be understood that the difference between $ND_{totl}$ 512 and the incoming signal level 502 is the $SNR_1$ 514, the SNR of the incoming signal 201 to the total noise $ND_{totl}$ 512.

Headroom 516 is defined as the difference between the signal level 502 and the full scale value of the ADC 206. In the case in which a fixed headroom 516 is maintained, the signal level 502 will be controlled by the AGC module 203 to maintain the fixed headroom 516 regardless of the value of the noise components or the SNR.

Figure 6:
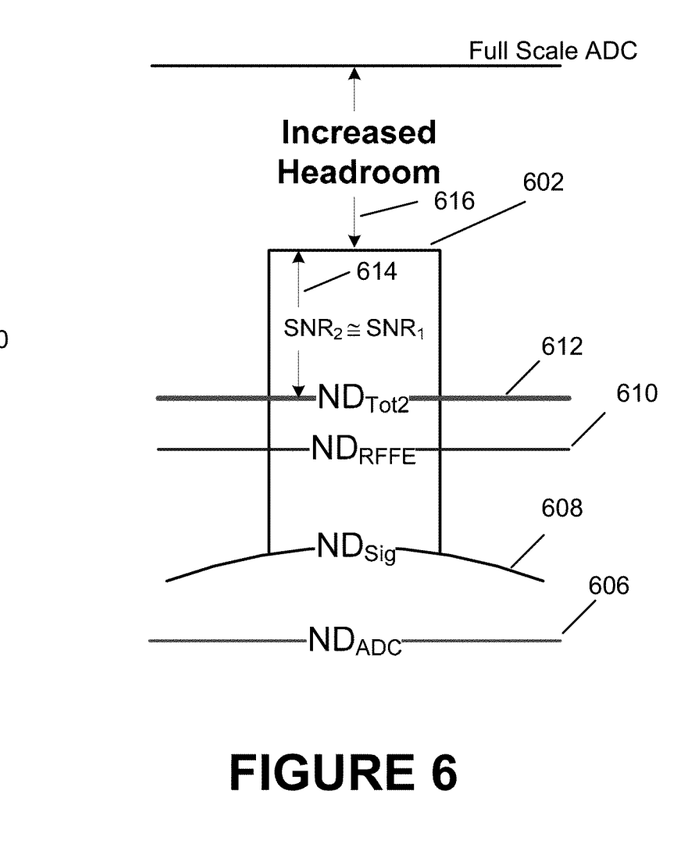
FIG. 6 illustrates the relationship between the headroom, the signal level, and the noise components with increased headroom in accordance with one embodiment of the presently disclosed method and apparatus.

FIG. 6 illustrates the relationship between the headroom 616, the signal level 602, and the noise components $ND_{ADC}$ 606, $ND_{Sig}$ 608, $ND_{RFFE}$ 610, $ND_{totl}$ 612 of a receiver front end 209 in accordance with one embodiment of the presently disclosed method and apparatus. By reducing the gain of the LNA 202, the levels $ND_{Sig}$ 608, $ND_{RFFE}$ 610, $ND_{totl}$ 612 will each be reduced to some extent. As the AGC Control Module 210 performs its above described functions, the amount of headroom 616 will increase while the $SNR_2$ remains essentially equal to $SNR_1$.

This will be the case as long as $ND_{Sig}$ 608+$ND_{RFFE}$ 610 is substantially greater than $ND_{ADC}$ 606. It should be noted that the depiction in FIG. 6 may not show the end result of the process that is illustrated in FIG. 4. That is, FIG. 6 may not depict $SNR_2$ 614 being at the minimum SNR value as determined in STEP 404. It can be seen by reference to FIG. 2 that since the noise components $ND_{Sig}$ 608 and $ND_{RFFE}$ 610 are present at the input to the AGC module 203, they will each be amplified or attenuated by whatever amplification or attenuation is provided by the AGC module 203. However, the noise component $ND_{ADC}$ 606 is generated in the ADC 206. Therefore, this component is not present at the input of the AGC module 203. Accordingly, changes in the amount of gain or attenuation provided by the AGC module 203 will not have any effect on $ND_{ADC}$ 606. Therefore, the result of lowering the gain of the AGC module when $ND_{ADC}$ 606 is substantially lower than $ND_{Sig}$ 608+$ND_{RFFE}$ 610 is to lower $ND_{totl}$ 612 by an amount that is essentially the same as the amount as the signal level 602. Thus, $SNR_2$ 614 remains essentially the same as $SNR_1$ 514.

However, it can be seen that there is a point at which reducing the gain further will cause the relative significance of $ND_{ADC}$ 606 to be such that a reduction in the gain (and thus the signal level 602) will cause the SNR to go down. One way to measure the point at which that affect becomes significant is to measure the delta SNR (i.e., the amount of change in SNR with a change in gain). It is for this reason that the delta SNR is monitored. In addition, the delta SNR is used to determine whether the gain has been reduced too much (see STEP 410 of FIG. 4). In accordance with one embodiment of the presently disclosed method and apparatus, the gain should not be reduced below the point at which $ND_{ADC}$ 606 starts to dominate be a significant portion of $ND_{tot1}$ 612. That is, ensuring the delta SNR is below a maximum value will ensure that the SNR does not drop significantly as a consequence of a reduction in the gain provided by the AGC module 203.

Figure 7:
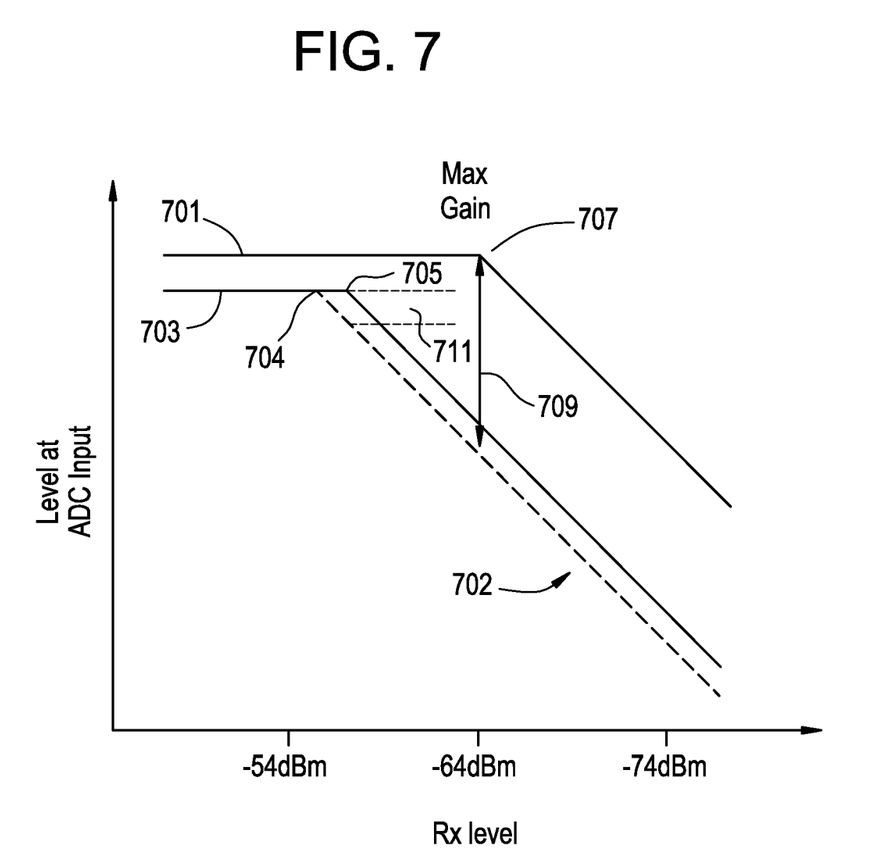
FIG. 7 illustrates the advantages in a receiver's ability to handle burst interference in accordance with the disclosed method and apparatus.

FIG. 7 illustrates the advantages achieved by the disclosed method and apparatus in terms of a receiver's ability to handle the burst interference. A first curve 701 shows the relationship between the signal level at the input to the ADC 206 and varying receive signal levels in a system in which the headroom is maintained at a fixed value. In such a system, the AGC module 203 will attenuate signals that come in at relatively high levels. When the received signal level gets lower, the AGC module 203 provides gain to ensure that the signal level at the input of the ADC 206 remains constant (i.e., constant headroom). This results in waste in the dynamic range of the ADC 206, as will be seen in more detail below.

A dashed line 702 illustrates the level required at the input to the ADC 206 to achieve an acceptable error rate for the received data. That is, for each receive level, when the level at the input to the ADC 206 is at least at the level indicated by the dashed line 702, the error rate will be acceptable. If the level at the input to the ADC 206 goes below that level, then the noise component $ND_{ADC}$ 606 will become sufficiently significant to effect SNR and thus increase the error rate. It should be noted that as the receive signal level goes down (moving from left to right across FIG. 7) the SNR will go down one dB for each one dB drop in receive signal level. That is, the noise components $ND_{RFFE}$ 610 and $ND_{Sig}$ 608 will remain constant while the signal level 502 decreases (See FIGURES and FIG. 6). Increases in the gain of the signal do not alter the SNR, just as decreases in the gain will not alter the SNR. That is, as noted in FIG. 5 and FIG. 6, as the gain is reduced (or increased), the amount of noise contributed by $ND_{RFFE}$ 610 and $ND_{Sig}$ 608 will also go down (or up), since these components of noise are directly amplified or attenuated by the AGC module 203. As noted above, as long as the sum of noise components $ND_{RFFE}$ 610 and $ND_{Sig}$ 608 is much greater than the noise component $ND_{ADC}$ 606 (which is not amplified by the AGC module 203), changes in the gain of the AGC module 203 will not affect the SNR.

In order to ensure that the data can be demodulated with an acceptable error rate, the modulation density of the transmitted signal is reduced sufficiently to ensure that the SNR of the received signal is sufficient to allow demodulation at the desired error rate. Modulation density is defined as the density of the modulation constellation used to represent the data. For example, data can be modulated using quadrature amplitude modulation (QAM) having a constellation with 1024 points. Alternatively, the data can be modulated with a less dense QAM constellation (e.g., 512 points). In accordance with one embodiment of the presently disclosed method and apparatus, an SNR of approximately 30.3 dB is required to achieve the desired error rate when the data is modulated with QAM 1024. For a modulation using half the number of constellation points (i.e., QAM 512), the SNR required drops by 3 dB. The SNR will drop an additional 3 dB each time the number of constellation points is reduced by one half.

In one embodiment in which the received signal is an OFDM modulated signal with bit loading (such as used in MoCA), a relatively large number of carriers are each modulated with a modulation density that is independent of the other carriers. Each carrier is modulated depending upon the conditions of that carrier. The adjustment to the modulation is averaged over all of the carriers. Accordingly, the amount of the change in the overall modulation density can be adjusted in relatively fine steps. This is because each carrier can change independently, having a relatively small impact on the modulation density of the overall signal. Accordingly, the change to the overall SNR required can be made in relatively small steps. That is, the amount of power in any one received carrier will be a relatively small percentage of the overall total power of the receive signal. Accordingly, small changes in the receive signal level can be offset by small changes in the modulation density of the overall signal by changing the modulation density of a small number of the carriers. The small changes in the modulation density translate to small changes in the SNR requirement represented by dashed line 702. Thus, the dashed line 702 representing the required SNR is a shown as a continuous line that drops smoothly at a rate of 1 dB for each dB drop in the level of the received signal (i.e., the steps are small enough to show the line as continuous rather than as a series of stair steps).

The dashed line 702 starts at an "Rx knee" 704. The Rx knee occurs at the point 704 at which the SNR drops below the level required to be able to accurately demodulate data at the required error rate. At that point, further increases in gain by the AGC module 203 will have relatively small impact on the SNR, since the sum of noise components $ND_{RFFE}$ 610 and $ND_{Sig}$ 608 is much greater than the noise component $ND_{ADC}$ 606. Therefore, the SNR requirement must be reduced by reducing the modulation density if the desired error rate is to be maintained. The dashed line 702 shows the curve of the reduction in the required SNR resulting from a reduction in the modulation density.

A second curve 703 shows the relationship between the level of the ADC input and the receive signal level for a system in which the SNR margin is maintained constant. If the SNR margin is maintained relatively constant, rather than maintaining the headroom constant for various levels at the input of the ADC 206, dynamic range that is otherwise wasted is reclaimed. That is, the ADC 206 can be operated closer to the center of its range, allowing more flexibility to handle deviations in receive signal level. That is, as long as the noise component $ND_{ADC}$ 606 remains well below the level of the noise components $ND_{RFFE}$ 610 and $ND_{Sig}$ 608, the amount of gain provided by the AGC module 203 will not affect the SNR. Therefore, adding more gain reduces the dynamic range of the ADC 206 without providing a significant benefit.

It should be noted that the ADC input level for curve 703 is lower (i.e., the gain applied by the AGC module 203 is less) even at relatively high receive signal levels. Thus, greater dynamic range is provided in the ADC 206. This is possible, since the SNR is acceptable at such lower levels. This reduction in the input level to the ADC 206 increases the dynamic range of the ADC 206. However, the advantage is even greater as the level of the receive signal goes down. This can be seen by the divergence of line 701 from line 703, starting at the point 705 and continuing up to the point 707 at which the gain of the AGC module 203 is at the maximum possible. At that point, the difference between the level shown in line 701 and line 703 remains constant. It should be noted that how much gain is provided above that necessary to ensure the SNR is sufficient to allow accurate demodulation at the highest modulation rate possible can vary depending upon implementation details within the particular embodiment of the disclosed method and apparatus.

At point 705, the amount of gain provided by the AGC module 203 can be reduced while maintaining a constant SNR margin 711. In contrast, if a fixed amount of headroom is maintained, the AGC module 203 continues to increase the amount of gain to maintain a constant ADC input level (i.e., maintain a fixed amount of headroom). This continues until the AGC module 203 reaches its maximum gain at the point 707. Only then does the level at the input of the ADC 206 begin to go down. It can be seen that in the case of a system operating in accordance with line 703, having a lower ADC input level allows for greater dynamic range. That is, since the ADC input level is lower, sudden bursts that cause the input level to rise will be less likely to be clipped.

When the receive signal level is −64 dBm, the difference between the dynamic range of the system operating with fixed headroom and the system operating with only enough gain to ensure that the maximum SNR margin is achieved reaches a maximum 709. It should be noted that at some point, a minimum level might be desired at the ADC 206 to keep the ADC input near the center of the dynamic range of the ADC 206. However, that would assume that there is sufficient gain available in the AGC module 203 to allow the signal to be boosted.

While various embodiments of the disclosed method and apparatus have been described above, it should be understood that they have been presented by way of example only, and should not limit the claimed invention. Likewise, the various diagrams may depict an example architectural or other configuration for the disclosed method and apparatus. This is done to aid in understanding the features and functionality that can be included in the disclosed method and apparatus. The claimed invention is not restricted to the illustrated example architectures or configurations, rather the desired features can be implemented using a variety of alternative architectures and configurations. Indeed, it will be apparent to one of skill in the art how alternative functional, logical or physical partitioning and configurations can be implemented to implement the desired features of the disclosed method and apparatus. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed method and apparatus is described above in terms of various exemplary embodiments and implementations, it should be understood that the various features, aspects and functionality described in one or more of the individual embodiments are not limited in their applicability to the particular embodiment with which they are described. Thus, the breadth and scope of the claimed invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A receiver front end comprising:
   a) an automatic gain control (AGC) module having an input and an output;
   b) an analog to digital converter (ADC) having an input and an output, the input coupled to the output of the AGC module; and
   c) an AGC control module having an input for receiving information regarding the signal output from the ADC and an output for controlling adjustments to the gain of the AGC module, the AGC control module reducing the gain of the AGC module in increments so long as the Signal to Noise Ratio (SNR) is above a minimum level.

2. The receiver front end of claim 1, further comprising an analog filter module coupled between the output of the AGC module and the input of the ADC.

3. The receiver front end of claim 1, wherein:
   d) when the SNR is above a minimum level, then the AGC control module determines whether a delta SNR is above a maximum level, and if the SNR is not above a minimum level, the AGC control module adjusts the gain up; and
   e) when the SNR is above a minimum level and the delta SNR is above a maximum level, then the AGC control module adjusts the gain up, otherwise, the AGC module adjusts the gain down.

4. The receiver front end of claim 1, wherein:
f) when the SNR is above a minimum level, then the AGC control module determines whether a delta SNR is above a maximum level, and if the SNR is not above a minimum level, the AGC control module determines whether there is sufficient headroom to adjust the gain up, and if so, then adjusts the gain up;
g) when the SNR is above a minimum level and the delta SNR is above a maximum level, the AGC control module determines whether there is sufficient headroom to adjust the gain up and if so, then adjusts the gain up, otherwise, the AGC control module adjusts the gain down.

5. The receiver front end of claim 1, wherein:
when the SNR is not above a minimum level and there is sufficient headroom, the AGC control module adjusts the gain up, and if either the SNR is above the minimum or there is insufficient headroom, the AGC control module adjusts the gain down.

6. The receiver front end of claim 1, wherein the receiver front end further includes a low noise amplifier (LNA), the output of the LNA being coupled to the input of the AGC module, and wherein the SNR is the ratio of the desired signal level to the level of the noise that is due to distortion that occurs in the ADC, noise that is received at the input of the LNA together with a signal coupled to the input of the LNA and any distortion that occurs to the incoming signal prior to reception at the input of the LNA and any noise generated within the LNA.

7. The receiver front end of claim 3, wherein determining whether a delta SNR is above a maximum level includes:
h) storing a first SNR value;
i) determining whether a previous SNR value has been stored; and
j) if a previous SNR value has been stored, then determining the delta SNR by calculating the absolute value of the difference between the previous SNR value and the current SNR value.

8. The receiver front end of claim 3, wherein d) and e) are repeated.

9. The receiver front end of claim 4, wherein f) and g) are repeated.

10. The receiver front end of claim 4, wherein adjustments to increase the gain are equal in size to adjustments to reduce the gain.

11. The receiver front end of claim 4, wherein adjustments to increase the gain are larger than adjustments to reduce the gain.

12. The receiver front end of claim 4, wherein adjustments to increase the gain are smaller than adjustments to reduce the gain.

13. The receiver front end of claim 4, wherein gain adjustments during an acquisition mode are greater than gain adjustments during a maintenance mode.

14. The receiver front end of claim 4, wherein the size of the gain adjustment is based on the number of consecutive times the gain has been adjusted in the same direction.

15. A method for controlling the gain of a receiver front end, comprising:
a) receiving an input signal;
b) measuring the signal to noise ratio (SNR) of the input signal;
c) determining a delta SNR level;
d) when the SNR is not below a minimum desired level and the delta SNR level is not above a maximum, then adjusting the gain of an AGC module down; and
e) repeating the above.

16. The method of claim 15, wherein determining the delta SNR includes making a first measurement of an SNR before making an adjustment to the gain of the AGC module, making a second measurement of an SNR after making an adjustment to the gain of the AGC module and determining the difference in the SNR between the first and second measurement.

17. The method of claim 15, further including increasing the gain of the AGC module when either the SNR is below the minimum desired level or the delta SNR level is above a maximum and there is sufficient headroom, and then repeating the method.

18. A method for controlling the gain of a receiver front end, comprising:
a) receiving an input signal;
b) measuring the signal to noise ratio (SNR) of the input signal;
c) when the SNR is not below a minimum desired level, then adjusting the gain of an AGC module down, otherwise determining whether there is sufficient headroom and if so adjusting the gain up; and
d) repeating the above.

19. A non-transitory, tangible computer readable storage medium having executable code which, when executed by a processor, will:
a) measure the signal to noise ratio (SNR) of an input signal;
b) when the SNR is not below a minimum desired level, then adjusting the gain of an AGC module down, otherwise determining whether there is sufficient headroom and if so, adjusting the gain up; and
c) repeat the above.

20. The non-transitory, tangible computer readable storage medium of claim 19, wherein the code will further adjust the gain down when there is insufficient headroom.

21. The non-transitory, tangible computer readable storage medium of claim 19, wherein the code will further:
d) determine a delta SNR level;
e) only if both the SNR is not below a minimum desired level and the delta SNR level is not above a maximum, then adjusting the gain of an AGC module down; and
f) repeating the above until either the SNR is below a minimum desired level or the delta SNR level is above a maximum.

* * * * *